(12) United States Patent
Khlat

(10) Patent No.: US 10,931,033 B2
(45) Date of Patent: Feb. 23, 2021

(54) MULTI-POLARIZATION MILLIMETER WAVE (MMWAVE) TRANSMITTER/RECEIVER ARCHITECTURE WITH SHARED POWER AMPLIFIERS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/731,284

(22) Filed: Dec. 31, 2019

(65) Prior Publication Data

US 2020/0235493 A1 Jul. 23, 2020

Related U.S. Application Data

(60) Provisional application No. 62/795,880, filed on Jan. 23, 2019.

(51) Int. Cl.

| H04B 1/44 | (2006.01) |
|---|---|
| H04B 7/10 | (2017.01) |
| H03F 3/24 | (2006.01) |
| H03F 3/68 | (2006.01) |
| H01Q 21/24 | (2006.01) |
| H01Q 21/06 | (2006.01) |

(52) U.S. Cl.
CPC ......... *H01Q 21/245* (2013.01); *H01Q 21/062* (2013.01); *H01Q 21/065* (2013.01); *H03F 3/245* (2013.01); *H03F 3/68* (2013.01); *H04B 1/44* (2013.01); *H04B 7/10* (2013.01); *H03F 2200/111* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| 5,659,322 | A | * | 8/1997 | Caille | H01Q 21/245 342/188 |
| 5,940,742 | A | * | 8/1999 | Dent | G08B 3/1008 340/7.22 |
| 8,345,716 | B1 | * | 1/2013 | Ehret | H04B 7/10 370/537 |
| 8,838,047 | B2 | * | 9/2014 | Rofougaran | H04B 5/0012 455/90.2 |
| 9,350,444 | B2 | * | 5/2016 | Tarighat Mehrabani | H04B 7/10 |

(Continued)

*Primary Examiner* — Lana N Le
(74) *Attorney, Agent, or Firm* — Withrow & Terranova, P.L.L.C.

(57) ABSTRACT

A multi-polarization millimeter wave (mmWave) transmitter/receiver (TX/RX) architecture with shared power amplifiers (PAs) is provided. This architecture provides a transceiver which uses shared PAs to reduce the number of TX and PA stages required for multi-polarization transmission in mmWave radio frequency (RF) devices. Embodiments provide an array of switching channels which selectively connect a shared TX and shared PA to two or more antennas in antenna arrays having different polarizations (e.g., a dipole antenna array and a patch antenna array). This approach provides a dual polarization or multi-polarization mmWave transceiver having a reduced number of components which results in a smaller size, improved power efficiency, and improved power heat dissipation.

20 Claims, 5 Drawing Sheets

(56) References Cited

U.S. PATENT DOCUMENTS

| | | | |
|---|---|---|---|
| 9,705,611 B1* | 7/2017 | West | H04B 17/21 |
| 10,707,942 B2* | 7/2020 | Strong | H04B 7/0452 |
| 10,720,985 B1* | 7/2020 | Kanar | H04B 7/0617 |
| 2004/0110469 A1* | 6/2004 | Judd | G01S 19/25 |
| | | | 455/15 |
| 2009/0009391 A1* | 1/2009 | Fox | H01Q 1/288 |
| | | | 342/372 |
| 2009/0009392 A1* | 1/2009 | Jacomb-Hood | H01Q 3/24 |
| | | | 342/374 |
| 2009/0023384 A1* | 1/2009 | Miller | H04B 7/2041 |
| | | | 455/12.1 |
| 2010/0130264 A1* | 5/2010 | Yong | H04B 7/10 |
| | | | 455/572 |
| 2010/0141527 A1* | 6/2010 | Lalezari | H01Q 21/24 |
| | | | 342/368 |
| 2010/0261440 A1* | 10/2010 | Corman | H01Q 3/34 |
| | | | 455/91 |
| 2012/0064825 A1* | 3/2012 | Landon | H04B 7/10 |
| | | | 455/39 |
| 2012/0189078 A1* | 7/2012 | Eom | H01Q 1/246 |
| | | | 375/295 |
| 2016/0143055 A1* | 5/2016 | Nammi | H04W 74/006 |
| | | | 370/329 |

\* cited by examiner

MULTI-POLARIZATION MILLIMETER WAVE (MMWAVE) TRANSMITTER/RECEIVER ARCHITECTURE WITH SHARED POWER AMPLIFIERS

RELATED APPLICATIONS

This application claims the benefit of provisional patent application Ser. No. 62/795,880, filed Jan. 23, 2019, the disclosure of which is hereby incorporated herein by reference in its entirety.

FIELD OF THE DISCLOSURE

This disclosure relates to millimeter wave (mmWave) transmitter/receiver architectures for fifth generation (5G) applications.

BACKGROUND

Mobile devices, such as cellular phones, demand increasingly smaller integrated circuits (ICs) including radio frequency (RF) circuits. In these mobile devices, RF transmission signals are generally amplified by one or more power amplifier (PA) stages in an RF front end before being emitted through an antenna. In addition, RF received signals from an antenna must by amplified by one or more low noise amplifier (LNA) stages in the RF front end. Fifth generation (5G) and future communications systems are expected to rely increasingly on millimeter wave (mmWave) spectrum (e.g., RF frequencies above 20 gigahertz (GHz)), which can require multiple arrays of antennas, increasing the size of the RF front end due to additional amplifiers and other components.

FIG. 1 illustrates a traditional transceiver 10 for transmitting and receiving mmWave RF signals with dual polarization. The traditional transceiver 10 includes an array of N mmWave dipole antennas 12, requiring 2N dipole transmitters 14 to generate a radiation pattern in a vertical plane 16 and 2N dipole receivers 18. Each dipole transmitter 14 includes at least one PA stage 20, and each dipole receiver 18 includes at least one LNA stage 22, with a dipole switch array 24 connecting the dipole transmitters 14 and the dipole receivers 18 to the dipole antennas 12.

The traditional transceiver 10 also includes an array of N mmWave patch antennas 26, requiring 2N patch transmitters 28 to generate a radiation pattern in a horizontal plane 30 and 2N patch receivers 32. Each patch transmitter 28 includes at least one PA stage 20, and each patch receiver 32 includes at least one LNA stage 22, with a patch switch array 34 connecting the patch transmitters 28 and the patch receivers 28 to the patch antennas 26. Thus, the traditional transceiver 10 is relatively large, requiring at least 4N PA stages 20 and 4N LNA stages 22.

SUMMARY

A multi-polarization millimeter wave (mmWave) transmitter/receiver (TX/RX) architecture with shared power amplifiers (PAs) is provided. This architecture provides a transceiver which uses shared PAs to reduce the number of transmitter and PA stages required for multi-polarization transmission in mmWave radio frequency (RF) devices. Embodiments provide an array of switching channels which selectively connect a shared TX and shared PA to two or more antennas in antenna arrays having different polarizations (e.g., a dipole antenna array and a patch antenna array).

This approach provides a dual polarization or multi-polarization mmWave transceiver having a reduced number of components which results in a smaller size, improved power efficiency, and improved power heat dissipation. Some examples use III-V semiconductor materials, such as gallium arsenide (GaAs), for the TXs to provide further performance improvements. In further examples, each switching channel also uses a RX and shared low noise amplifier (LNA) to provide further improvements in size, power efficiency, and power heat dissipation.

An exemplary embodiment provides a switch array for a mmWave transceiver. The switch array includes a first array of switching channels. Each switching channel includes a TX port configured to couple to a shared PA; a first antenna port configured to couple to one of a first array of mmWave antennas having a first polarization; a second antenna port configured to couple to one of a second array of mmWave antennas having a second polarization; a first TX switch connected between the TX port and the first antenna port; and a second TX switch connected between the TX port and the second antenna port. The first array of switching channels is configured to selectively operate in a first TX mode and a second TX mode. The first TX mode comprises enabling each first TX switch while disabling each second TX switch. The second TX mode comprises enabling each second TX switch while disabling each first TX switch.

Another exemplary embodiment provides a mmWave RF device. The mmWave RF device includes a first mmWave antenna array having a first polarization. The mmWave RF device further includes a second mmWave antenna array having a second polarization. The mmWave RF device further includes a shared PA array. The mmWave RF device further includes a first array of switching channels. Each switching channel includes a first TX switch connected between one shared PA of the shared PA array and one antenna of the first mmWave antenna array; and a second TX switch connected between the one shared PA and one antenna of the second mmWave antenna array. The first array of switching channels is configured to selectively enable each first TX switch while disabling each second TX switch in a first TX mode and enable each second TX switch while disabling each first TX switch in a second TX mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
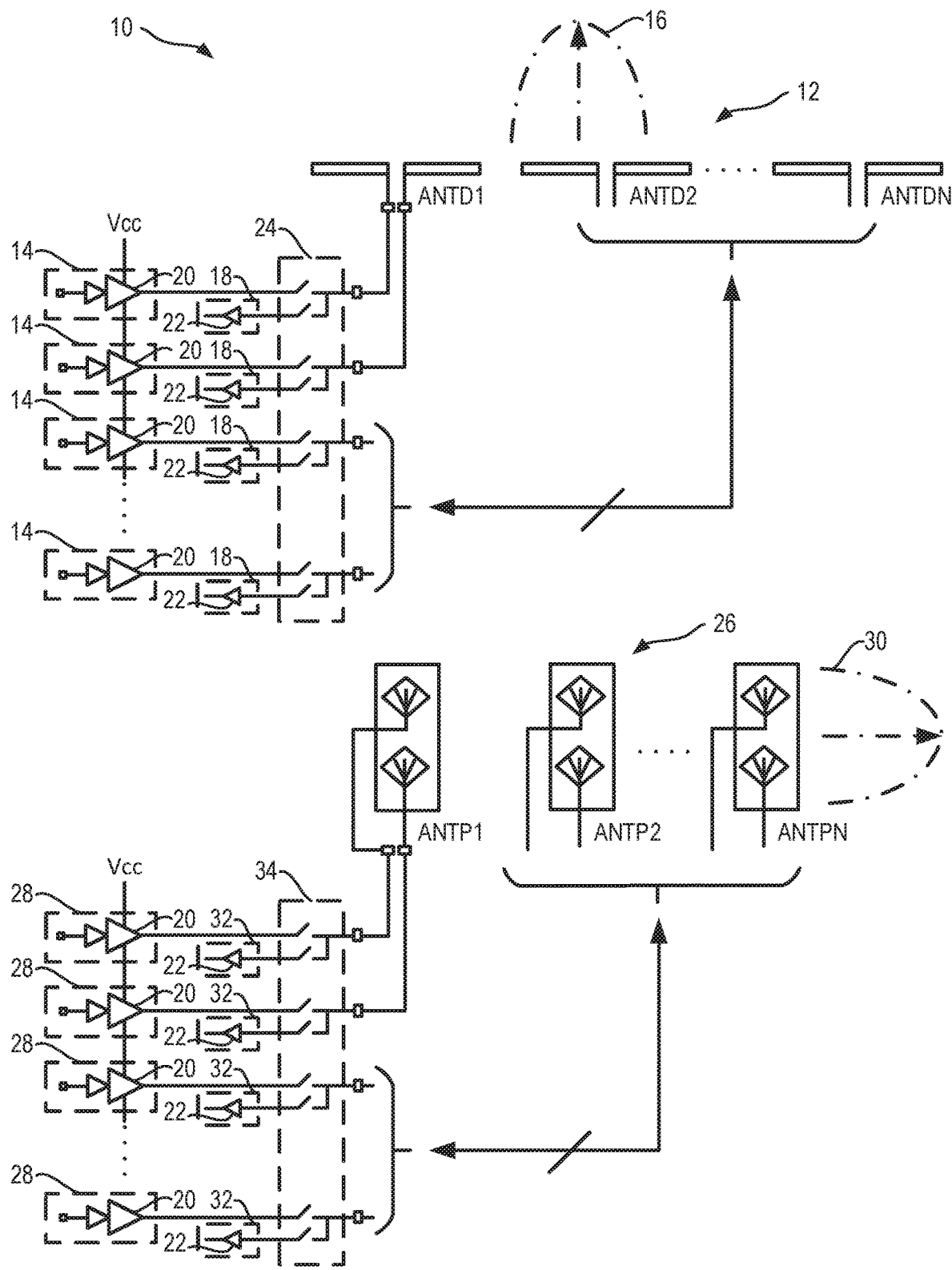
FIG. 1 illustrates a traditional transceiver for transmitting and receiving millimeter wave (mmWave) radio frequency (RF) signals with dual polarization.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A multi-polarization millimeter wave (mmWave) transmitter/receiver (TX/RX) architecture with shared power amplifiers (PAs) is provided. This architecture provides a transceiver which uses shared PAs to reduce the number of TX and PA stages required for multi-polarization transmission in mmWave radio frequency (RF) devices. Embodiments provide an array of switching channels which selectively connect a shared TX and shared PA to two or more antennas in antenna arrays having different polarizations (e.g., a dipole antenna array and a patch antenna array).

This approach provides a dual polarization or multi-polarization mmWave transceiver having a reduced number of components which results in a smaller size, improved power efficiency, and improved power heat dissipation. Some examples use III-V semiconductor materials, such as gallium arsenide (GaAs), for the TXs to provide further performance improvements. In further examples, each switching channel also uses a shared RX and shared low noise amplifier (LNA) to provide further improvements in size, power efficiency, and power heat dissipation.

Figure 2:
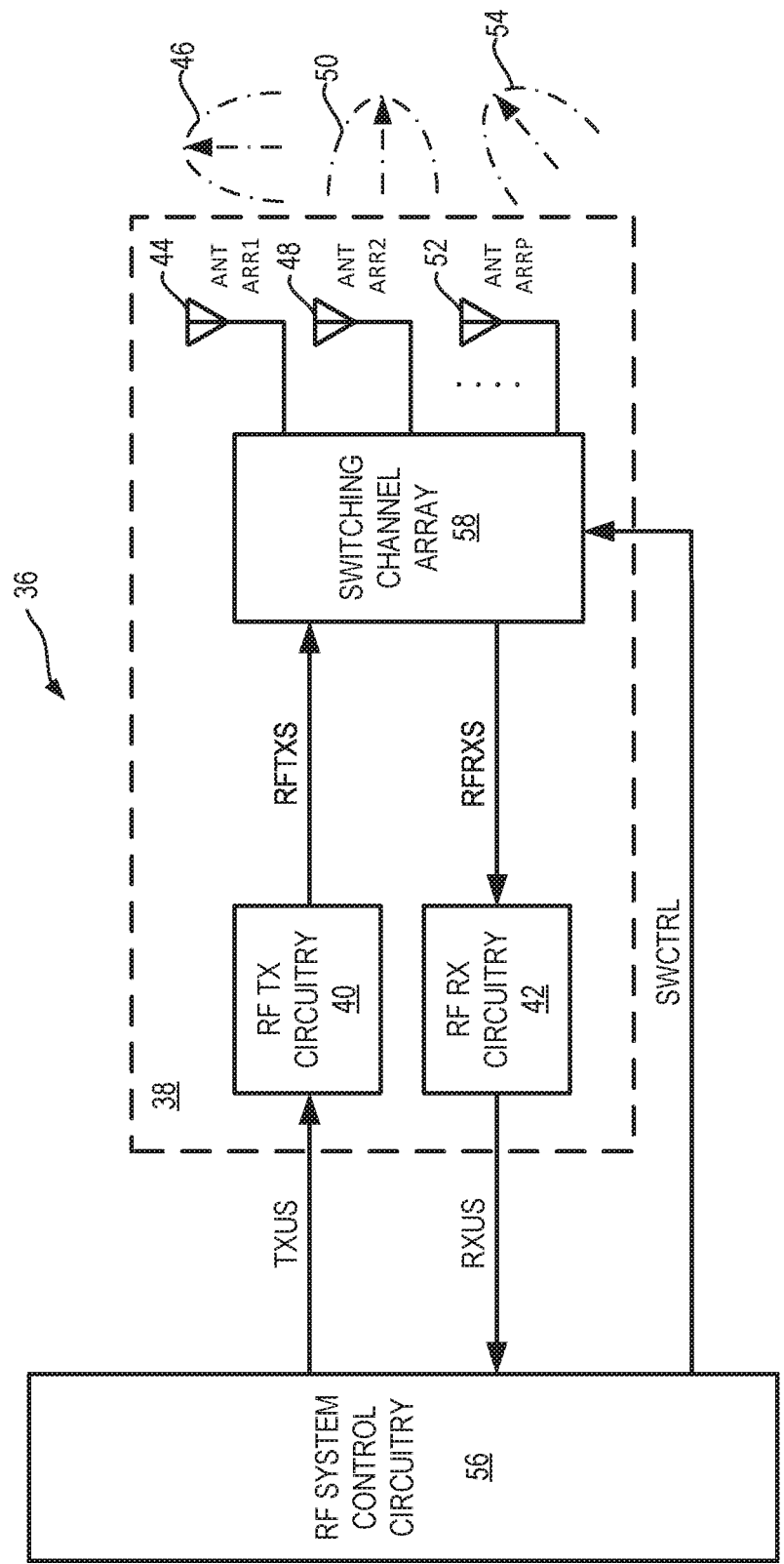
FIG. 2 is a schematic diagram of an exemplary mmWave RF device which includes a transceiver with RF transmitter (TX) circuitry and RF receiver (RX) circuitry for sending and receiving mmWave signals.

FIG. 2 is a schematic diagram of an exemplary mmWave RF device 36 which includes a transceiver 38 with RF TX circuitry 40 and RF RX circuitry 42 for sending and receiving mmWave signals. The transceiver 38 transmits and receives mmWave RF signals with multi-polarization (e.g., dual polarization or more). As such, the transceiver 38 further includes at least a first mmWave antenna array 44 having a first polarization 46 and a second mmWave antenna array 48 having a second polarization 50. For example, the first mmWave antenna array 44 can comprise dipole antennas which generate a radiation pattern in a vertical plane (the first polarization 46), while the second mmWave antenna array 48 comprises patch antennas (or differently oriented dipole or other antennas) which generate a radiation pattern in a horizontal plane (the second polarization 50).

In some embodiments, the transceiver 38 includes additional mmWave antenna arrays 52, which can provide additional polarizations 54, provide multi-input multi-output (MIMO) functionality, provide greater flexibility in transmission and reception schemes, and so on. For example, one additional mmWave antenna array 52 can have the first polarization 46 and be separately controlled from the first antenna array 44.

In an exemplary aspect, RF system control circuitry 56 provides an upstream TX signal TXUS to the RF TX circuitry 40. The RF TX circuitry 40 processes the upstream TX signal TXUS to provide an RF TX signal RFTXS to be transmitted over an antenna array 44, 48, 52. The RF TX circuitry 40 may include up-conversion circuitry, amplification circuitry, power supply circuitry, filtering circuitry, switching circuitry, combining circuitry, splitting circuitry, dividing circuitry, clocking circuitry, the like, or any combination thereof to process the upstream TX signal TXUS.

The RF RX circuitry 42 receives and processes an RF RX signal RFRXS from an antenna array 44, 48, 52 to provide an upstream RX signal RXUS. The RF RX circuitry 42 may include down-conversion circuitry, amplification circuitry, low noise amplification circuitry, power supply circuitry, filtering circuitry, switching circuitry, combining circuitry, splitting circuitry, dividing circuitry, clocking circuitry, the like, or any combination thereof.

In an exemplary aspect, the transceiver 38 includes an array of switching channels 58 which selectively connect an array of shared PAs in the RF TX circuitry 40 to one of the antenna arrays 44, 48, 52. Accordingly, in a first TX mode the array of switching channels 58 connects the array of shared PAs to the first mmWave antenna array 44. In a second TX mode, the array of switching channels 58 connects the array of shared PAs to the second mmWave antenna array 48. Other modes may connect to the additional mmWave antenna arrays 52.

In another aspect, the array of switching channels 58 selectively connects one of the antenna arrays 44, 48, 52 to an array of LNAs in the RF RX circuitry 42. For example, in a first RX mode the array of switching channels 58 connects the first mmWave antenna array 44 to the array of LNAs. In a second TX mode, the array of switching channels 58 connects the second mmWave antenna array 48 to the array of LNAs. Other modes may connect with the additional mmWave antenna arrays 52.

The RF system control circuitry 56 provides a switch control signal SWCTRL to the array of switching channels 58 to control its operation. In some examples, the switch control signal SWCTRL selects a mode of operation for the array of switching channels 58, and additional control circuitry implements the selection. In other examples, the RF system control circuitry 56 provides direct control of the array of switching channels 58. This approach provides a dual polarization or multi-polarization mmWave transceiver 36 having a reduced number of components, as described further below with respect to FIGS. 3A and 3B.

Figure 3A:
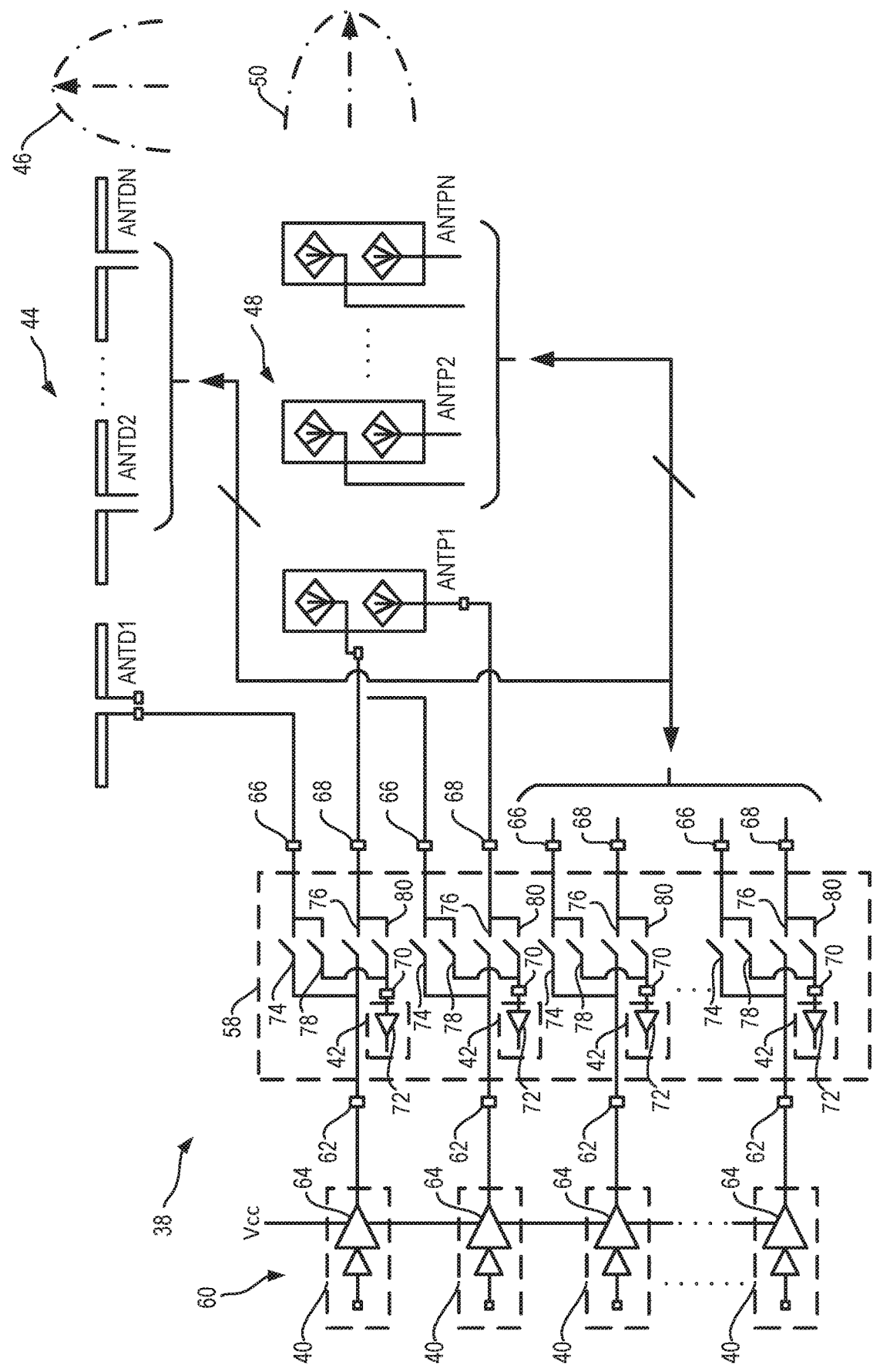
FIG. 3A is a schematic diagram of an embodiment of the transceiver of FIG. 2 having an array of switching channels connecting a shared power amplifier (PA) array with two or more antenna arrays.

FIG. 3A is a schematic diagram of an embodiment of the transceiver 38 of FIG. 2 having an array of switching channels 58 connecting a shared PA array 60 with two or more antenna arrays 44, 48. Each switching channel in the array of switching channels 58 includes a TX port 62 which couples to a shared PA 64 in the RF TX circuitry 40. A first antenna port 66 couples to one of the first mmWave antenna arrays 44 having the first polarization 46, and a second antenna port 68 couples to one of the second mmWave antenna arrays 48 having the second polarization 50. In the exemplary embodiment of FIG. 3A, an RX port 70 couples to a shared LNA 72 in the RF RX circuitry 42.

Embodiments of the array of switching channels 58 reduce the number of TXs and PA stages required for multi-polarization transmission by selecting either the first mmWave antenna array 44 as active or the second mmWave antenna array 48 as active. This facilitates using 2N TXs (e.g., including 2N shared PAs 64, half as many as the traditional transceiver 10 of FIG. 1) in the RF TX circuitry 40 to power both the first mmWave antenna array 44 and the second mmWave antenna array 48 having N antennas each. In the exemplary embodiment of FIG. 3A, the array of switching channels 58 further reduces the number of RXs and LNA stages, using 2N RXs (e.g., including 2N shared LNAs 72, half as many as the traditional transceiver 10 of FIG. 1) in the RF RX circuitry 42.

In this regard, each switching channel in the array of switching channels 58 includes a first TX switch 74 connected between the TX port 62 and the first antenna port 66. A second TX switch 76 is connected between the TX port 62 and the second antenna port 68. The array of switching channels 58 is configured to selectively operate in a first TX mode and a second TX mode. In the first TX mode, each first TX switch 74 is enabled while each second TX switch 76 is disabled. In the second TX mode, each second TX switch 76 is enabled while each first TX switch 74 is disabled.

In the exemplary embodiment of FIG. 3A, each switching channel in the array of switching channels 58 further includes a first RX switch 78 connected between the RX port 70 and the first antenna port 66. A second RX switch 80 is connected between the RX port 70 and the second antenna port 68. The array of switching channels 58 is further configured to selectively operate in a first RX mode and a second RX mode. In the first RX mode, each first RX switch 78 is enabled while each second RX switch 80 is disabled. In the second RX mode, each second RX switch 80 is enabled while each first RX switch 78 is disabled.

In some examples, the first RX switch 78 is operated in conjunction with the first TX switch 74 (e.g., such that the first mmWave antenna array 44 is selected for both TX and RX together), and the second RX switch 80 is operated in conjunction with the second TX switch 76 (e.g., such that the second mmWave antenna array 48 is selected for both TX and RX together). In other examples, the first RX switch 78 and the first TX switch 74 are operated separately, and the second RX switch 80 and the second TX switch 76 are operated separately (e.g., such that the first mmWave antenna array 44 is selected for TX while the second mmWave antenna array 48 is selected for RX, or vice versa).

In an exemplary aspect, each shared PA 64 is formed with a III-V semiconductor technology, such as GaAs. Such III-V semiconductor technologies can further improve the transceiver 38 by compensating for and/or overcoming the added insertion loss of the additional switches in the array of switching channels 58. For example, use of GaAs for the shared PAs 64 (e.g., with a pseudomorphic high electron mobility transistor (pHEMT) process) can provide lower current drain even with the presence of the additional selection switches (e.g., the second TX switch 76, which can add approximately 1 decibel (dB) of insertion loss) but it offers still better performances of current drain compared to using 4N PAs using complementary metal-oxide-semiconductor (CMOS) processes and/or silicon-based processes. Other III-V semiconductor technologies may also be used to provide similar benefits, such as one or more of gallium nitride (GaN), indium phosphide (InP), or indium gallium arsenide (InGaAs).

In some examples, the array of switching channels 58 is disposed on a common substrate with the shared PA array 60 (e.g., GaAs or another III-V semiconductor technology). This may further improve performance and/or reduce the size of the transceiver 38. In other examples, the array of switching channels 58 is additionally or alternatively disposed on a common substrate with the shared LNAs 72 (which may be formed with the same or a different semiconductor technology). In other examples, the array of switching channels 58 is disposed on a separate substrate from the shared PA array 60 and the shared LNAs 72. In further examples, the array of switching channels 58, the shared PA array 60, and the shared LNAs 72 are placed in an encapsulated module (e.g., whether disposed on separate substrates or shared substrates).

Figure 3B:
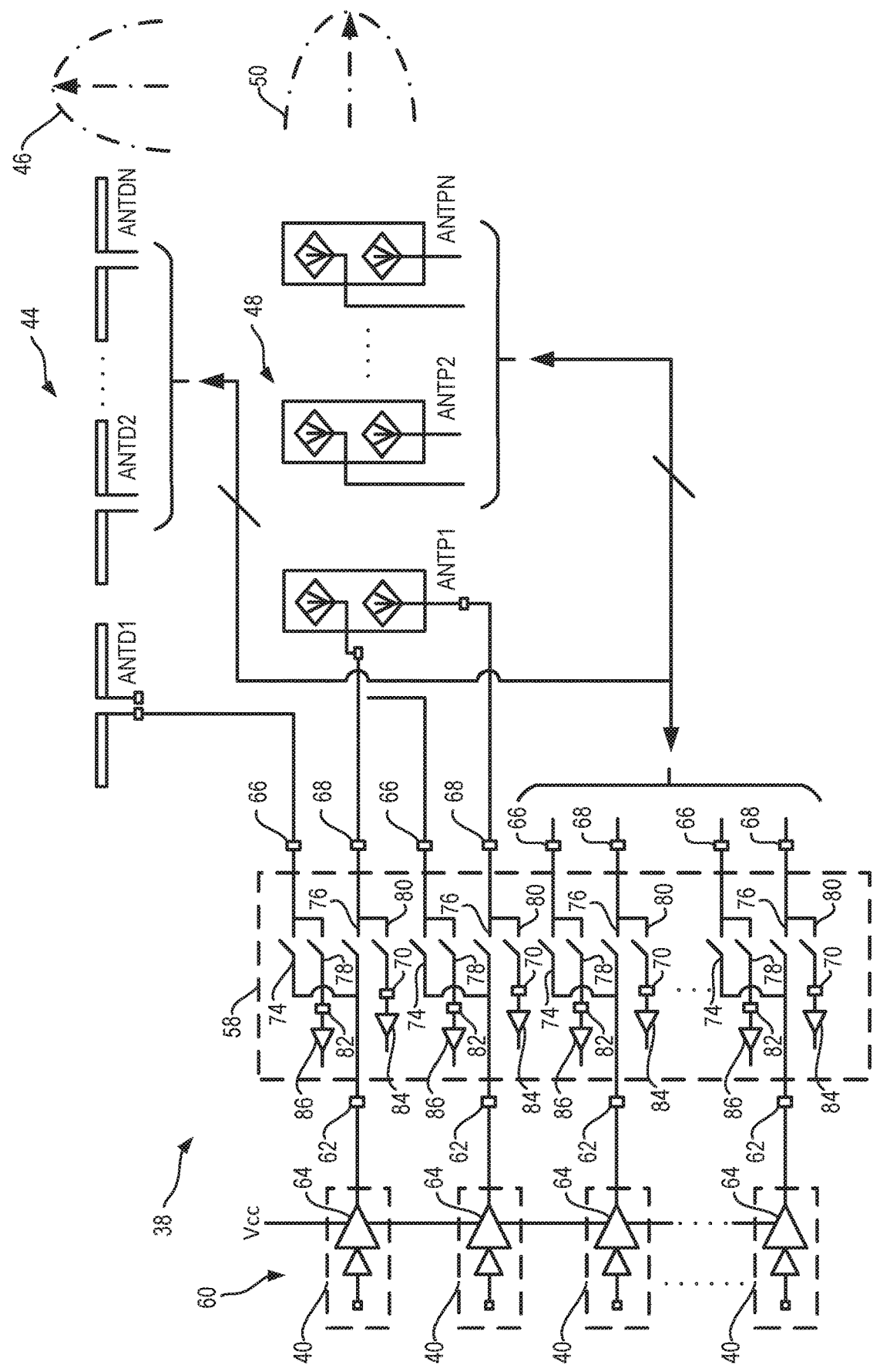
FIG. 3B is a schematic diagram of another embodiment of the transceiver of FIG. 3A.

FIG. 3B is a schematic diagram of another embodiment of the transceiver 38 of FIG. 3A. In this embodiment, the array of switching channels 58 provides a reduced number of TXs and PA stages (e.g., using 2N TXs, half as many as the traditional transceiver 10 of FIG. 1). However, there may still be 4N RXs deployed (e.g., where the added insertion loss of the embodiment of FIG. 3A is undesirable), with a dedicated RX (and LNA) for each antenna array 44, 48.

In this regard, each switching channel in the array of switching channels 58 includes a second RX port 82 in addition to the first RX port 70. The first RX port 70 is coupled to a first LNA 84, and the second RX port 82 is coupled to a second LNA 86. Each first RX switch 78 is connected between the first RX port 70 and the first antenna port 66. Each second RX switch 80 is connected between the second RX port 82 and the second antenna port 68. The array of switching channels 58 may be otherwise configured and operated as described above with respect to FIG. 3A. It should be understood that each pair of a first LNA 84 and a second LNA 86 can have a post-LNA switch (not shown) to select one or the other to route to further components of the RF RX circuitry 42 of FIG. 2.

FIGS. 3A and 3B are illustrated with one array of switching channels 58 selectively connecting the RF TX circuitry 40 (including shared PAs 64) and the RF RX circuitry 42 (including shared LNAs 72 or first LNAs 84 and second LNAs 86) with the first mmWave antenna array 44 or the second mmWave antenna array 48. It should be understood, however, that some embodiments may including a second or more arrays of switching channels which selectively connect additional shared PA arrays (and LNA arrays) with additional antenna arrays having other polarizations. For example, the transceiver 38 can include additional mmWave antenna arrays 52 such as illustrated in FIG. 2, which can provide additional polarizations, provide MIMO functionality, provide greater flexibility in transmission and reception schemes, and so on. In some examples, such additional mmWave antenna arrays 52 can have a common polarization with the first mmWave antenna array 44 and/or the second mmWave antenna array 48, but be separately controlled to provide greater flexibility. In some examples, a second (and/or additional) array of switching channels can operate in the first TX mode and the second TX mode, as well as the first RX mode and the second RX mode.

Figure 4:
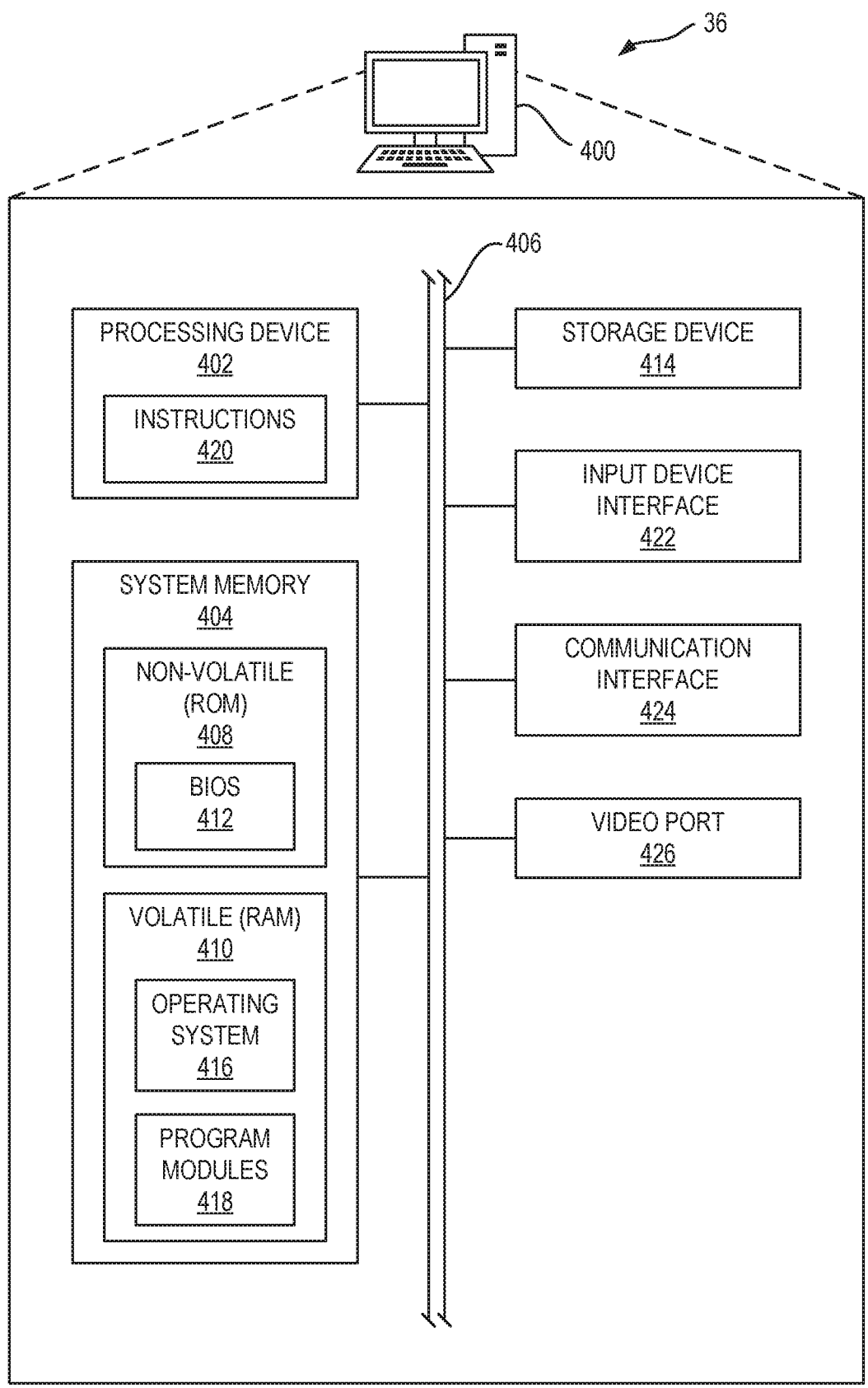
FIG. 4 is a block diagram of the mmWave RF device of FIG. 2 suitable for sending and receiving mmWave signals with multi-polarization according to embodiments disclosed herein.

FIG. 4 is a block diagram of the mmWave RF device 36 of FIG. 2 suitable for sending and receiving mmWave signals with multi-polarization according to embodiments disclosed herein. The mmWave RF device 36 includes or is implemented as a computer system 400, which comprises any computing or electronic device capable of including firmware, hardware, and/or executing software instructions that could be used to perform any of the methods or functions described above, such as providing the switch control signal SWCTRL to the array of switching channels 58 to control its operation (e.g., to select between the first mmWave antenna array 44 and the second mmWave antenna array 48). In this regard, the computer system 400 may be a circuit or circuits included in an electronic board card, such as a printed circuit board (PCB), a server, a personal computer, a desktop computer, a laptop computer, an array of computers, a personal digital assistant (PDA), a computing pad, a mobile device, or any other device, and may represent, for example, a server or a user's computer.

The exemplary computer system 400 in this embodiment includes a processing device 402 or processor, a system memory 404, and a system bus 406. The system memory 404 may include non-volatile memory 408 and volatile memory 410. The non-volatile memory 408 may include read-only memory (ROM), erasable programmable read-only memory (EPROM), electrically erasable programmable read-only memory (EEPROM), and the like. The volatile memory 410 generally includes random-access memory (RAM) (e.g., dynamic RAM (DRAM), such as synchronous DRAM (SDRAM)). A basic input/output system (BIOS) 412 may be stored in the non-volatile memory 408 and can include the basic routines that help to transfer information between elements within the computer system 400.

The system bus 406 provides an interface for system components including, but not limited to, the system memory 404 and the processing device 402. The system bus 406 may be any of several types of bus structures that may further interconnect to a memory bus (with or without a memory controller), a peripheral bus, and/or a local bus using any of a variety of commercially available bus architectures.

The processing device 402 represents one or more commercially available or proprietary general-purpose processing devices, such as a microprocessor, central processing unit (CPU), or the like. More particularly, the processing device 402 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 402 is configured to execute processing logic instructions for performing the operations and steps discussed herein.

In this regard, the various illustrative logical blocks, modules, and circuits described in connection with the embodiments disclosed herein may be implemented or performed with the processing device 402, which may be a microprocessor, a field programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 402 may be a microprocessor, or may be any conventional processor, controller, microcontroller, or state machine. The processing device 402 may also be implemented as a combination of computing devices (e.g., a combination of a DSP and a microprocessor, a plurality of microprocessors, one or more microprocessors in conjunction with a DSP core, or any other such configuration).

The computer system 400 may further include or be coupled to a non-transitory computer-readable storage medium, such as a storage device 414, which may represent an internal or external hard disk drive (HDD), flash memory, or the like. The storage device 414 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as optical disks, magnetic cassettes, flash memory cards, cartridges, and the like, may also be used in the operating environment, and, further, that any such media may contain computer-executable instructions for performing novel methods of the disclosed embodiments.

An operating system 416 and any number of program modules 418 or other applications can be stored in the volatile memory 410, wherein the program modules 418 represent a wide array of computer-executable instructions corresponding to programs, applications, functions, and the like that may implement the functionality described herein in whole or in part, such as through instructions 420 on the processing device 402. The program modules 418 may also reside on the storage mechanism provided by the storage device 414. As such, all or a portion of the functionality described herein may be implemented as a computer program product stored on a transitory or non-transitory computer-usable or computer-readable storage medium, such as the storage device 414, volatile memory 410, non-volatile memory 408, instructions 420, and the like. The computer program product includes complex programming instructions, such as complex computer-readable program code, to cause the processing device 402 to carry out the steps necessary to implement the functions described herein.

An operator, such as the user, may also be able to enter one or more configuration commands to the operating system 416 through a keyboard, a pointing device such as a mouse, or a touch-sensitive surface, such as the display device, via an input device interface 422 or remotely through a web interface, terminal program, or the like via a communication interface 424. The communication interface 424 may be wired or wireless and facilitate communications with any number of devices via a communications network in a direct or indirect fashion. An output device, such as a display device, can be coupled to the system bus 406 and driven by a video port 426. Additional inputs and outputs to the computer system 400 may be provided through the system bus 406 as appropriate to implement embodiments described herein.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

What is claimed is:

1. A switch array for a millimeter wave (mmWave) transceiver, the switch array comprising:
   a first array of switching channels, each switching channel comprising:
      a transmitter (TX) port configured to couple to a shared power amplifier (PA);
      a first antenna port configured to couple to one of a first array of mmWave antennas having a first polarization;
      a second antenna port configured to couple to one of a second array of mmWave antennas having a second polarization;
      a first TX switch connected between the TX port and the first antenna port; and
      a second TX switch connected between the TX port and the second antenna port;
   wherein:
      the first array of switching channels is configured to selectively operate in a first TX mode and a second TX mode;
      the first TX mode comprises enabling each first TX switch while disabling each second TX switch; and
      the second TX mode comprises enabling each second TX switch while disabling each first TX switch.

2. The switch array of claim 1, wherein the first array of mmWave antennas comprises dipole antennas.

3. The switch array of claim 2, wherein the second array of mmWave antennas comprises patch antennas.

4. The switch array of claim 1, wherein the first array of switching channels is disposed on a common substrate with an array of shared PAs coupled to each TX port of the first array of switching channels.

5. The switch array of claim 4, wherein the common substrate comprises a III-V semiconductor technology.

6. The switch array of claim 1, wherein each switching channel of the first array of switching channels further comprises:
   a first receiver (RX) port configured to couple to a first low noise amplifier (LNA); and
   a first RX switch connected between the first RX port and the first antenna port.

7. The switch array of claim 6, further comprising a second RX switch connected between the first RX port and the second antenna port;
   wherein:
      the first array of switching channels is further configured to selectively operate in a first RX mode or a second RX mode;
      the first RX mode comprises enabling each first RX switch while disabling each second RX switch; and
      the second RX mode comprises enabling each second RX switch while disabling each first RX switch.

8. The switch array of claim 6, wherein each switching channel of the first array of switching channels further comprises:
   a second RX port configured to couple to a second LNA; and
   a second RX switch connected between the second RX port and the second antenna port;
   wherein:
      the first array of switching channels is further configured to selectively operate in a first RX mode or a second RX mode;
      the first RX mode comprises enabling each first RX switch while disabling each second RX switch; and
      the second RX mode comprises enabling each second RX switch while disabling each first RX switch.

9. The switch array of claim 6, wherein the first array of switching channels is disposed on a common substrate with an array of LNAs coupled to each first RX port of the first array of switching channels.

10. The switch array of claim 1, further comprising a second array of switching channels configured to selectively operate in the first TX mode or the second TX mode.

11. The switch array of claim 10, wherein the second array of switching channels is configured to operate in the first TX mode when the first array of switching channels is operated in the first TX mode.

12. The switch array of claim 10, wherein the second array of switching channels is configured to operate in the second TX mode when the first array of switching channels is operated in the first TX mode.

13. A millimeter wave (mmWave) radio frequency (RF) device, comprising:
   a first mmWave antenna array having a first polarization;
   a second mmWave antenna array having a second polarization;
   a shared power amplifier (PA) array; and a first array of switching channels, each switching channel comprising:
- a first transmitter (TX) switch connected between one shared PA of the shared PA array and one antenna of the first mmWave antenna array; and
- a second TX switch connected between the one shared PA and one antenna of the second mmWave antenna array;

wherein the first array of switching channels is configured to selectively enable each first TX switch while disabling each second TX switch in a first TX mode and enable each second TX switch while disabling each first TX switch in a second TX mode.

14. The mmWave RF device of claim 13, wherein each PA of the shared PA array is formed with a III-V semiconductor technology.

15. The mmWave RF device of claim 14, wherein the III-V semiconductor technology comprises at least one of gallium arsenide (GaAs), gallium nitride (GaN), indium phosphide (InP), or indium gallium arsenide (InGaAs).

16. The mmWave RF device of claim 13, wherein the first array of switching channels is disposed on a common substrate with the shared PA array.

17. The mmWave RF device of claim 13, further comprising a shared low noise amplifier (LNA) array;

wherein each switching channel of the first array of switching channels comprises:
- a first receiver (RX) switch connected between one shared LNA of the shared LNA array and the one antenna of the first mmWave antenna array; and
- a second RX switch connected between the one shared LNA and the one antenna of the second mmWave antenna array.

18. The mmWave RF device of claim 17, wherein the first array of switching channels is disposed on a common substrate with the shared LNA array.

19. The mmWave RF device of claim 17, wherein the first array of switching channels, the shared PA array, and the shared LNA array comprise an encapsulated RF module.

20. The mmWave RF device of claim 19, wherein the first array of switching channels is disposed on a separate substrate from the shared PA array and the shared LNA array.

* * * * *